United States Patent
Cros

(10) Patent No.: US 10,564,184 B2
(45) Date of Patent: Feb. 18, 2020

(54) METHODS TO MANUFACTURE SEMICONDUCTOR PROBE TIPS

(71) Applicant: Advantest America, Inc., San Jose, CA (US)

(72) Inventor: Florent Cros, Los Angeles, CA (US)

(73) Assignee: Advantest America, Inc., San Jose, CA (US)

( * ) Notice: Subject to any disclaimer, the term of this patent is extended or adjusted under 35 U.S.C. 154(b) by 0 days.

(21) Appl. No.: 15/428,931

(22) Filed: Feb. 9, 2017

(65) Prior Publication Data

US 2017/0153273 A1    Jun. 1, 2017

Related U.S. Application Data

(62) Division of application No. 14/178,171, filed on Feb. 11, 2014, now Pat. No. 9,678,108.

(60) Provisional application No. 61/936,480, filed on Feb. 6, 2014.

(51) Int. Cl.
*G01R 1/067* (2006.01)
*G01R 31/28* (2006.01)

(52) U.S. Cl.
CPC ..... *G01R 1/06738* (2013.01); *G01R 1/06761* (2013.01); *G01R 31/2886* (2013.01); *Y10T 29/49204* (2015.01)

(58) Field of Classification Search
None
See application file for complete search history.

(56) References Cited

U.S. PATENT DOCUMENTS

| | | | |
|---|---|---|---|
| 4,161,692 A | 7/1979 | Tarzwell | |
| 5,177,438 A * | 1/1993 | Littlebury | G01R 1/06711 324/72.5 |
| 5,378,164 A | 1/1995 | Vidacovich et al. | |
| 6,016,061 A * | 1/2000 | Mizuta | G01R 1/06738 324/755.07 |
| 6,144,212 A | 11/2000 | Mizuta | |
| 6,356,090 B2 | 3/2002 | Deshayes | |
| 7,015,707 B2 | 3/2006 | Cherian | |
| 7,208,964 B2 | 4/2007 | Mine et al. | |
| 7,567,089 B2 * | 7/2009 | Chen | G01R 1/0483 324/755.11 |

(Continued)

FOREIGN PATENT DOCUMENTS

| | | |
|---|---|---|
| JP | H06140480 | 5/1994 |
| KR | 20000059206 | 10/2000 |

(Continued)

OTHER PUBLICATIONS

Tathireddy, P., et al., "Fabrication of 3-Dimensional Silicon Microelectrode Arrays Micro Electro Discharge Machining for Neural Applications", Department of Electrical and Computer Engineering, University of Utah, Salt Lake City, USA.

(Continued)

*Primary Examiner* — Nasima Monsur

(57) ABSTRACT

An apparatus for electrically testing a semiconductor device comprises a probe card comprising a probe, wherein the probe comprises a probe tip. Further, the probe tip comprises a foot with an arbitrarily sized cross-section and an apex with an arbitrarily sized cross-section, wherein the cross-section of the foot is wider than the cross-section of the apex.

10 Claims, 15 Drawing Sheets

(56) References Cited

U.S. PATENT DOCUMENTS

| | | | |
|---|---|---|---|
| 7,607,342 B2 | 10/2009 | Huang et al. | |
| 7,671,610 B2 | 3/2010 | Kister | |
| 7,692,438 B2 | 4/2010 | Machida et al. | |
| 7,786,740 B2 | 8/2010 | Kister | |
| 8,674,717 B2 | 3/2014 | Yonezawa | |
| 2002/0084794 A1 | 7/2002 | Root | |
| 2002/0163349 A1 | 11/2002 | Wada et al. | |
| 2002/0180473 A1* | 12/2002 | Di Stefano | G01R 1/06727 324/755.07 |
| 2003/0098700 A1* | 5/2003 | Yoshida | G01R 1/06738 324/754.2 |
| 2005/0164428 A1 | 7/2005 | Liu et al. | |
| 2006/0267622 A1* | 11/2006 | Lagowski | G01R 31/312 324/754.21 |
| 2007/0018633 A1 | 1/2007 | Hirakawa et al. | |
| 2007/0145988 A1 | 6/2007 | Garabedian et al. | |
| 2007/0182427 A1 | 8/2007 | Chen et al. | |
| 2007/0256299 A1 | 11/2007 | Chartarifsky et al. | |
| 2007/0259456 A1* | 11/2007 | Gritters | G01R 1/06738 438/14 |
| 2007/0268035 A1 | 11/2007 | Yamaguchi | |
| 2008/0122470 A1 | 5/2008 | Lu | |
| 2008/0131983 A1* | 6/2008 | Lin | H01L 22/22 438/18 |
| 2008/0290887 A1 | 11/2008 | Yamazaki | |
| 2009/0001486 A1 | 1/2009 | Heck et al. | |
| 2009/0201041 A1 | 8/2009 | Kister | |
| 2009/0212805 A1 | 8/2009 | Chen et al. | |
| 2009/0237099 A1 | 9/2009 | Garabedian et al. | |
| 2010/0103806 A1 | 4/2010 | Chou et al. | |
| 2010/0237888 A1 | 9/2010 | Desta et al. | |
| 2011/0285417 A1 | 11/2011 | Kimoto | |
| 2012/0032697 A1* | 2/2012 | Khoo | G01R 1/06727 324/755.07 |
| 2012/0068727 A1 | 3/2012 | Rathburn | |
| 2012/0192319 A1 | 7/2012 | Li et al. | |
| 2012/0280703 A1 | 11/2012 | Crippa | |
| 2012/0286816 A1 | 11/2012 | Kister | |
| 2012/0319711 A1 | 12/2012 | Hung et al. | |
| 2013/0234746 A1 | 9/2013 | Namburi | |
| 2013/0234747 A1 | 9/2013 | Namburi | |
| 2013/0285688 A1 | 10/2013 | Namburi et al. | |
| 2014/0132298 A1 | 5/2014 | Cros et al. | |
| 2014/0347084 A1 | 11/2014 | Hu et al. | |

FOREIGN PATENT DOCUMENTS

| | | |
|---|---|---|
| KR | 20100051269 | 5/2010 |
| WO | WO2006073736 | 7/2006 |

OTHER PUBLICATIONS

Rakwal, Dinesh, et al., "Fabrication of Compliant High Aspect Ratio Silicon Microelectrode Arrays Using Micro-Wire Electrical Discharge Machining ", Microsysst Technol, vol. 15, pp. 789-797, Springer-Verlag, Feb. 21, 2009.

* cited by examiner

METHODS TO MANUFACTURE SEMICONDUCTOR PROBE TIPS

CROSS-REFERENCES TO RELATED APPLICATIONS

The present application is a divisional of, claims the benefit of and priority to U.S. application Ser. No. 14/178,171, filed Feb. 11, 2014, entitled "METHODS TO MANUFACTURE SEMICONDUCTOR TIPS", and hereby incorporated by reference in its entirety, which claims the benefit of and priority to U.S. Provisional Application No. 61/936,480, filed Feb. 6, 2014, which is incorporated by reference.

TECHNICAL FIELD

Embodiments of the present disclosure relate generally to the field of semiconductor probe tips for semiconductor testing and more specifically to the field of semiconductor probe tip fabrication with an arbitrarily small apex cross-section and an arbitrarily wide foot cross-section.

BACKGROUND

Several desirable attributes for a probe tip include, but are not limited to: an adequate level of structural robustness, a small apex cross-section-to-tip-height ratio, and a small apex area. An adequate level of structural robustness may provide some immunity to the range of tangential or shear forces encountered during normal operation. A small apex cross-section-to-tip-height ratio may assist with the placement of the probe tip and avoid unnecessary contact with ancillary structures surrounding the electrical feature of interest on the semiconductor die (e.g., a contact pad or solder bump). Finally, a small apex area may increase local pressure and ease any required scratching of oxide layers over the electrical structures of interest and facilitate the penetration of metallic surfaces.

In light of these desired design features, a possible probe tip shape that meets these desirable attributes may include a conical or pyramid shape. In other words, a desirable probe tip shape may define a volume with a large base, providing mechanical robustness to shear forces, and a small apex for efficient scratching of metal oxides and penetration of metallic surfaces.

Such conical or pyramid-shaped probe tips may be manufactured utilizing molds. However, such manufacturing methods based upon the use of a defined mold and its subsequent filling (e.g., electro-deposition or electroplating) suffer from limitations pertaining to the types of geometries that can be achieved during the definition of the mold itself, especially when the mold is the result of a photolithographic process. Although photolithographic processes can provide molds of an arbitrary shape and height, they typically yield molds with straight sidewalls, essentially oriented along an axis perpendicular to the surface underneath. Cone, truncated cone, or pyramid shapes are generally more difficult to achieve via photolithography alone.

SUMMARY OF THE INVENTION

This present invention provides a solution to the challenges inherent in manufacturing semiconductor probe tips. In a method according to one embodiment of the present invention, a method for manufacturing a semiconductor probe tip with an arbitrarily small apex cross-section and an arbitrarily wide foot cross-section is disclosed. In one embodiment, a metallic structure is formed in a cavity with one conductive sidewall. The cavity with a conductive sidewall may be formed from a plurality of cavities to allow the formation of the metallic structure with an arbitrarily sized small apex cross-section and an arbitrarily sized wide foot cross-section.

In a method according to one embodiment of the present invention, a method for forming a semiconductor probe tip is disclosed. The method comprises depositing a first copper layer onto exposed electrically conductive areas of a wafer. The first copper layer surrounds a non-conductive polymer structure on the wafer. The non-conductive polymer structure is removed to form a primary cavity in the first copper layer. The wafer and the primary cavity are coated with a polymer layer. Regions of the polymer layer are removed to form a secondary cavity within and alongside the primary cavity. A metal layer is deposited on exposed electrically conductive areas of the wafer and within bounds of the secondary cavity.

In one exemplary embodiment, the method further comprises removing the polymer layer and depositing a second copper layer to cover exposed electrically conductive areas of the wafer, the first copper layer, and the metal layer. The second copper layer is planarized so that an upper surface of the first copper layer is substantially exposed. Planarizing the second copper layer removes any of the metal layer above the upper surface of the first copper layer. The first and second copper layers are selectively etched to reveal a remaining portion of the metal layer. The remaining portion of the metal layer comprises a semiconductor probe tip. A cross-section of an apex of the semiconductor probe tip is narrower than a cross-section of a foot of the semiconductor probe tip.

In an apparatus according to one embodiment of the present invention, the apparatus comprises a probe card comprising a probe. The probe comprises a probe tip. The probe tip comprises a foot with an arbitrarily sized cross-section, and an apex with an arbitrarily sized cross-section. The cross-section of the foot is wider than the cross-section of the apex.

BRIEF DESCRIPTION OF THE DRAWINGS

The present invention will be better understood from the following detailed description, taken in conjunction with the accompanying drawing figures in which like reference characters designate like elements and in which.

DETAILED DESCRIPTION

Figure 1:
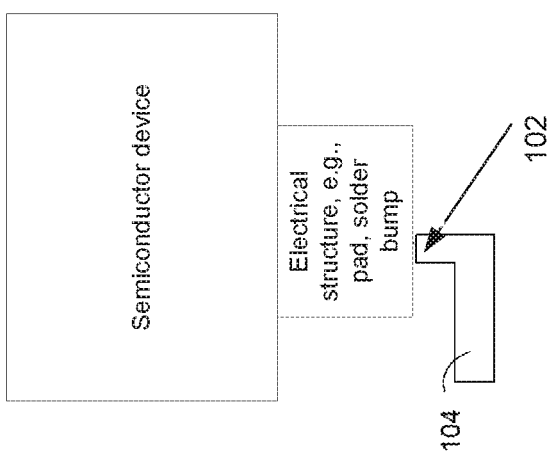
FIG. 1 illustrates an exemplary schematic cross-section of a semiconductor probe tip in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

As discussed herein, there are many challenges inherent in manufacturing a conical or pyramid-shaped probe tip through photolithographic techniques alone. For example, following conventional photolithography techniques, an apex of a probe tip may be formed that is not that much narrower than the probe tip's foot. Such exemplary probe tip structures are generally two dimensional structures that are extruded in a third direction. When a photoresist window or cavity is filled with a metal to form the probe tip, the probe tip will be shaped as a cube or a rectangular shape (following the same dimensions as the cavity in the photoresist). In other words, there are tradeoffs: if a probe tip is designed to have a large surface area at the foot (to provide robustness to the probe tip and a generous amount of gluing surface between the probe tip foot and an underlying surface), the resulting apex that contacts an electrical feature of interest will have approximately the same cross-section as the base, and such a cross-section may be too large for the apex.

This present invention provides a solution to the increasing challenges inherent in manufacturing semiconductor probe tips. Various embodiments of the present disclosure provide an exemplary probe tip with a foot with an arbitrarily wide cross-section and an apex with an arbitrarily narrow cross-section. The cross-section of the apex may be narrower than the cross-section of the foot. Embodiments of the present invention, as discussed herein, circumvent the previously mentioned limitations by using a manufacturing process capable of producing probe tips with arbitrarily small apex and arbitrarily large feet. As discussed in detail herein, arbitrary dimensions for the foot and the apex are provided through manufacturing steps that utilize a primary cavity and a secondary cavity, and where a sidewall of the secondary cavity comprises a conductive surface.

As discussed in detail below, the resulting mold or cavity will comprise a conductive sidewall, with the remaining sidewalls non-conductive. In other words, in addition to the bottom of the cavity, one of the sidewalls will also be conductive. Therefore, during an exemplary electroplating process, a metal layer may grow from the bottom of the cavity, directly on the conductive portions of substrate, as well as on the conductive sidewall of the cavity. As discussed herein, when one of the four sides of a photoresist cavity is replaced with a conductive material, an exemplary electroplating process may grow a metal layer from the bottom of the photoresist cavity as well as from the conductive sidewall of the cavity. In one embodiment, such a metal layer will form a contiguous, L-shaped metal layer.

As discussed herein, an exemplary tip 100 is a part of a probe that engages mechanically with a semiconductor chip, and under favorable circumstances, establishes electrical contact with the semiconductor chip for the duration of the test. In one embodiment, the tip 100 will mechanically engage with electrical structures on the semiconductor chip, such as pads and solder bumps. In one embodiment, an apex 102 of the tip 100 refers to a distal part of the tip 100, that is, a part of the tip 100 that engages with a semiconductor chip. A foot 104 of the tip 100 refers to a proximal part of the tip 100, that is, a part of the tip 100 that is mechanically attached to the rest of the probe. In one embodiment, a structure of interest, such as an electrical pad may be recessed and surrounded by a wall of dielectric or passivation material. Therefore, in one embodiment, an apex 102 may have a sufficient height above a foot 104 to ensure that as the apex 102 penetrates an opening in a dielectric or passivation layer of several microns surrounding an electrical structure of interest, the apex 102 will be able to engage with a surface of the electrical structure of interest without the foot 104 coming into contact with the surrounding dielectric or passivation layers.

Figure 2:
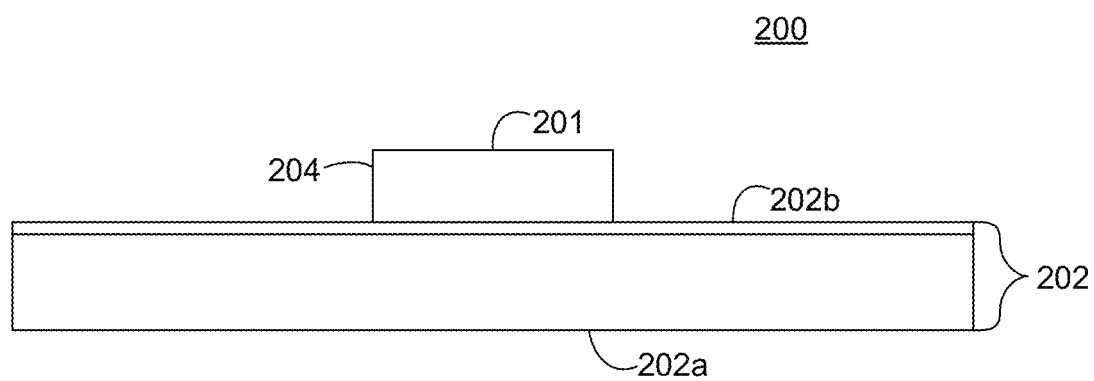
FIGS. 2, 3, 4, and 5 illustrate exemplary schematic cross-sections of a semiconductor device illustrating the formation of a primary cavity during a process for fabricating a semiconductor probe tip in accordance with an embodiment of the present invention.

FIGS. 2-7 illustrate exemplary cross-sectional views of a fabrication process for manufacturing an exemplary semiconductor probe tip. In FIG. 2, a polymer structure 201 and a conductive layer 202b are formed on a wafer 202a. In one embodiment, a wafer 202a refers to a slice of semiconductor or insulating material, such as silicon, ceramic or glass. In one embodiment, the wafer 202a may be coated with one or more conductive layers 202b, including but not limited to: gold, copper, and nickel. The wafer 202a and the conductive layers 202b may be collectively referred to as a substrate 202.

In one embodiment, the polymer structure 201 is made of a non-conductive polymer. In one embodiment, the polymer structure 201 is fabricated using photolithographic techniques. Conditions of the photolithographic process may generally influence the verticality of sidewalls 204 of the polymer structure 201. For example, the sidewalls 204 may form an angle as small as 80 degrees and as large as 100 degrees with a surface of the substrate 202. As discussed herein, the polymer structure 201 may be any arbitrary shape and size as determined through exemplary photolithographic process steps. Depending on the requirements of the application, one or more similar structures may be built simultaneously.

Figure 3:
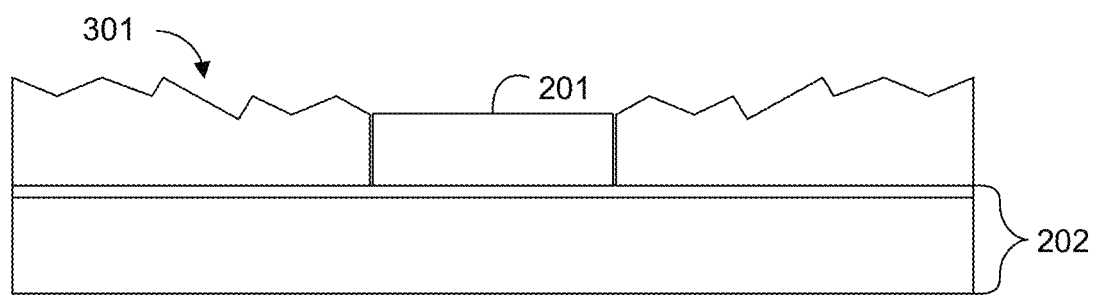

As illustrated in FIG. 3, a layer of copper (Cu) 301 may be deposited onto the conductive layers 202b of the substrate 202. Using electroplating techniques, it is possible to restrict the growth of copper to regions of the substrate 202 that are electrically conductive and directly exposed to the plating process that is devoid of polymer structures, such as the polymer structure 201. As illustrated in FIG. 3, during the electroplating processing, a copper layer 301 is deposited on any electrically conductive surface (e.g., the conductive layers 202b of the substrate 202), such that the copper layer 301 surrounds the polymer structure 201.

Figure 4:
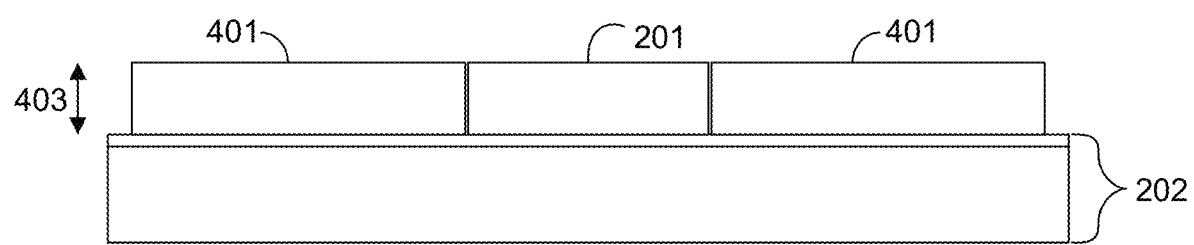

FIG. 4 illustrates a cross-sectional view of an exemplary copper layer 401 after the original copper layer 301 (illustrated in FIG. 3) has been subjected to a planarization process. In one embodiment, the planarization process may utilize one or more techniques such as polishing, lapping or fly-cutting. Such planarization processes may be used to control and define a thickness 403 of the copper layer 401.

Figure 5:
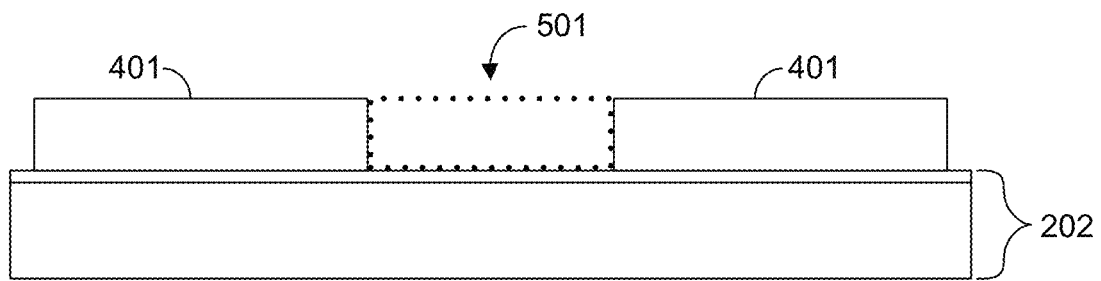

As illustrated in FIG. 5, the polymeric structure 201, illustrated in FIGS. 2-4, may be removed, leaving a negative space 501 with a predictable size and shape. In FIG. 5, the negative space 501 is indicated with a dotted line. In one embodiment, the negative space 501 replicates with a desired level of fidelity a shape and size of the removed polymer structure 201. Hereinafter, the negative space 501 is also referred to as a primary cavity 501.

Figure 6:
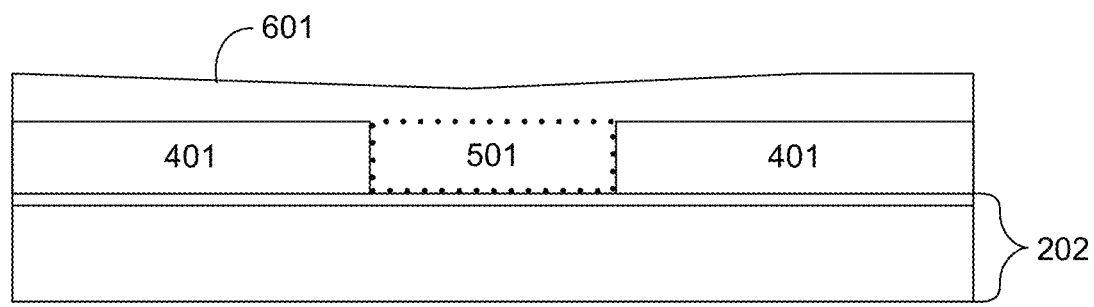
FIGS. 6 and 7 illustrate exemplary schematic cross-sections along line A-A of FIG. 8 of a semiconductor device illustrating the formation of a secondary cavity during a process for fabricating a semiconductor probe tip in accordance with an embodiment of the present invention.

As illustrated in FIG. 6, the substrate 202, the copper layer 401, and the primary cavity 501 may be coated with a polymer layer 601. In one example, the polymer of choice may be a photosensitive epoxy with a level of viscosity chosen so as to fill-up the primary cavity 501, as well as resulting in a coating substantially flat. As illustrated in FIG. 6, the polymer layer responds with a plastic flow so as to fill the primary cavity 501 on the exposed conductive surface of the substrate 202.

Figure 7:
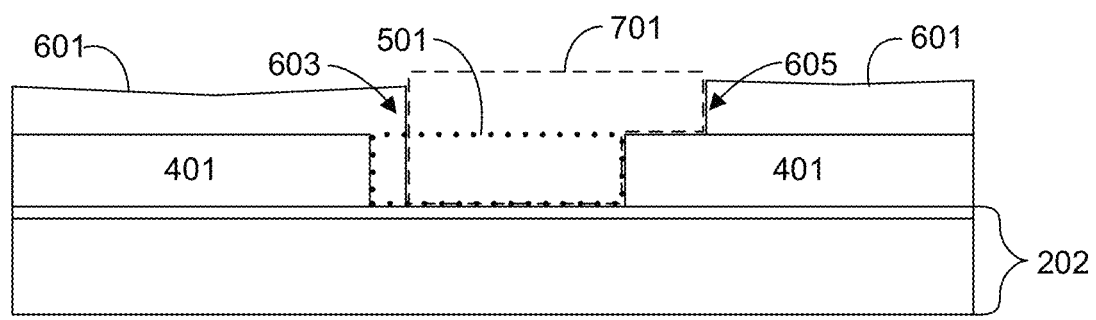

As illustrated in FIG. 7, regions of the polymer 601 may be removed, using, for example, a photolithographic process, leaving a second negative space 701, also referred to as a secondary cavity 701. The secondary cavity 701 is represented in FIG. 7 with a dashed line (with the primary cavity 501 still represented by a dotted line). In one embodiment, illustrated in FIG. 7, the bounds of the secondary cavity 701 extend geographically from a location situated within the bounds of the primary cavity 501, to a location situated on the copper regions 401 surrounding the primary cavity 501. As illustrated in FIG. 7, a left-hand sidewall of the secondary cavity 701 is a sidewall 603 of the polymer layer 601, while a right-hand sidewall of the secondary cavity 701 is a right-hand step comprising a portion of the copper layer 401 and a sidewall 605 of the polymer layer 601. Therefore, as illustrated in FIG. 7, while the left-hand sidewall of the secondary cavity 701 comprises a non-conductive sidewall (formed from sidewall 603 of the polymer layer 601), the right-hand sidewall of the secondary cavity 701 comprises a conductive portion (formed from the copper layer 401) and a non-conductive portion (formed from the sidewall 605 of the polymer layer 601).

Figure 8:
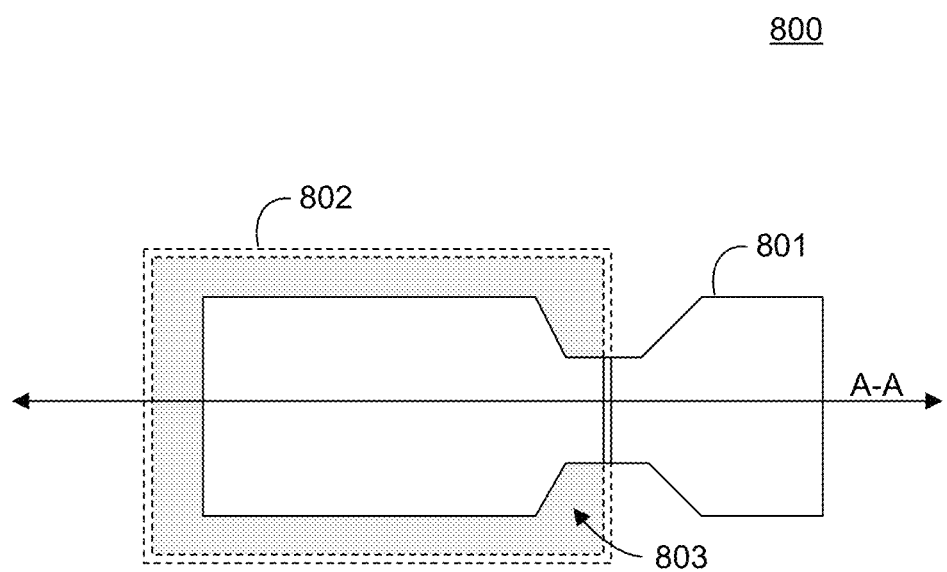
FIG. 8 illustrates an exemplary top-down view of the primary cavity and the secondary cavity of FIG. 7 during the process for fabricating a semiconductor probe tip in accordance with an embodiment of the present invention.

While FIG. 7 illustrates a cross-section of an exemplary primary cavity 501 and secondary cavity 701, FIG. 8 illustrates a top-down view of a possible geometry 801 for the secondary cavity 701, represented by a solid line, and a possible geometry 802 of the primary cavity 501, represented by double dashed lines. In one embodiment, the cross-section illustrated in FIG. 7, is taken at line A-A in FIG. 8.

As illustrated in FIG. 8, portions of the primary cavity 501 that remain buried under the polymer 601 are defined by the double dashed lines 802 and the solid line 801. In other words, the portions of the primary cavity 501 that are buried under the polymer layer 601 lie between the outline of the exemplary geometry 802 of the primary cavity 501 and the outline of the exemplary geometry 801 of the secondary cavity 701. As illustrated in FIG. 8, the buried portion 803 of the primary cavity 501 is shaded.

Figure 9:
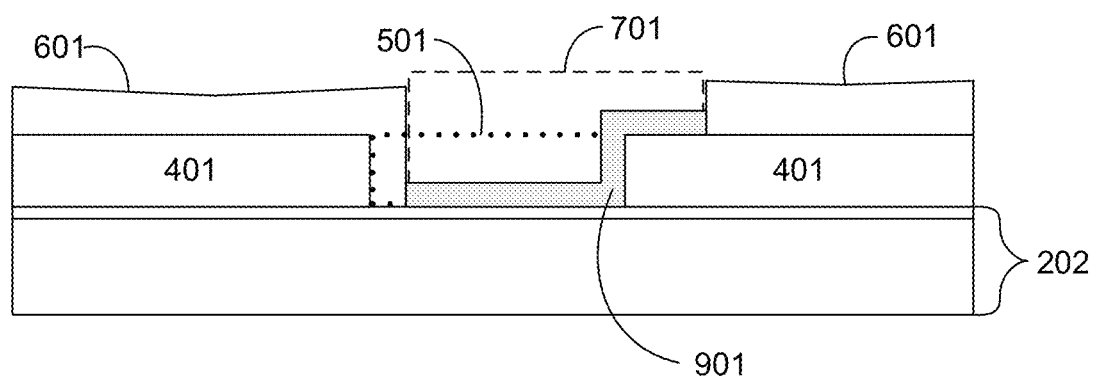
FIGS. 9, 10, 11, 12, and 13 illustrate exemplary schematic cross-sections of a semiconductor device illustrating the formation of a metallic structure in the primary and secondary cavities of FIG. 7 during the process for fabricating a semiconductor probe tip in accordance with an embodiment of the present invention.

As illustrated in FIG. 9, after the secondary cavity 701 has been formed, a metal layer 901 may be deposited into the primary cavity 701. In one embodiment, as illustrated in FIG. 9, a metal layer 901 is deposited on the substrate 202. As illustrated in FIG. 9, the metal layer 901 is deposited on an exposed portion of the conductive layer 202b of the substrate 202. Using electroplating, it is possible to limit a growth of the electroplated material to only regions of the wafer 202 within the bounds of the secondary cavity 701.

As illustrated in FIG. 9, it is therefore possible to grow a continuous metal structure 901 which extends from the bottom of a portion of the primary cavity 501 (as defined by the secondary cavity 701), continues along one or more sections of the sidewalls of the primary cavity 501, as well as on regions of the copper layer 401 that surrounds the primary cavity 501. Using electroplating, it is also possible to control the nature, composition, and thickness of the metal layer 901. In one exemplary embodiment, the metal layer 901 is made out of rhodium, nickel, gold, or nickel/rhodium. In another embodiment, the metal layer 901 is comprised of two or more layers of similar or dissimilar materials. As illustrated in FIG. 9, the electroplating may deposit a metal layer 901 on the exposed conductive layer 202b of the substrate 202, a sidewall of the copper layer 401, and along an exposed portion of a top surface of the copper layer 401. In one exemplary embodiment, as illustrated in FIG. 9, the metal layer 901 comprises a contiguous S-shape.

Figure 10:
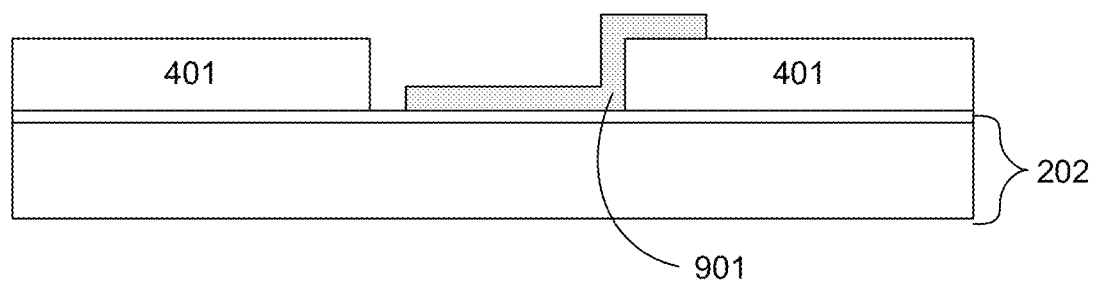

As illustrated in FIG. 10, after the metal layer 901 has been formed, the polymer layer 601 (that was used to form the secondary cavity 701) may be removed. In one embodiment, the polymer layer 601 is removed with a solvent.

Figure 11:
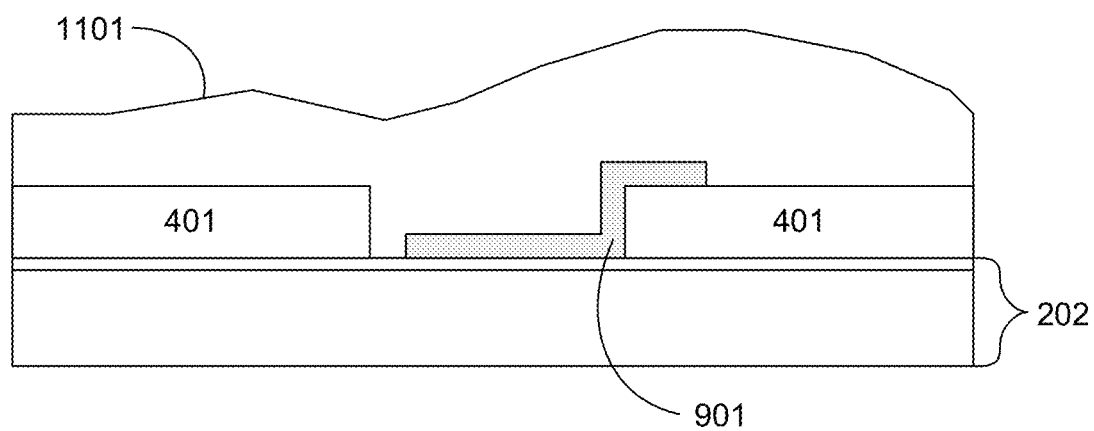

As illustrated in FIG. 11, a layer of copper 1101 may be deposited to coat the remaining exposed conductive surfaces. As illustrated in FIG. 11, the electroplating deposits a copper layer 1101 over the original copper layer 401, over an exposed portion of the conductive layer 202b of the substrate 202, and over the metal layer 901. In one embodiment, the layer of copper 1101 is deposited by submerging the semiconductor device into a plating solution of copper to encapsulate the substrate 202 and exposed layers in a copper layer 1101.

Figure 12:
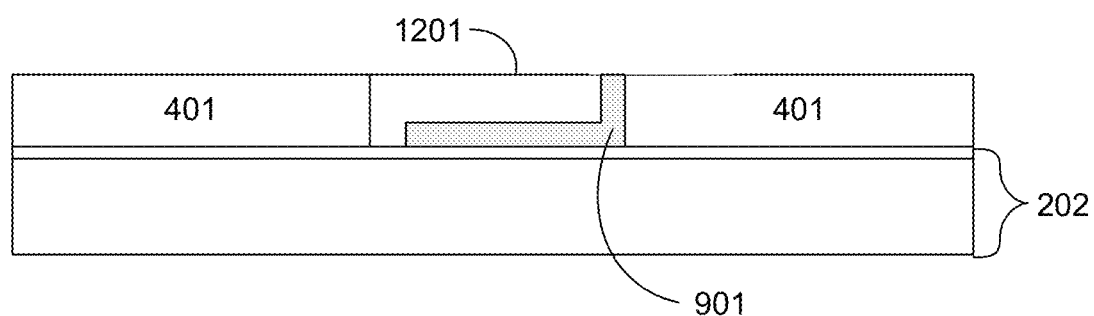

As illustrated in FIG. 12, after the copper layer 1101 has been deposited, the copper layer 1101 and the metal layer 901 may be subjected to a planarization process. In one embodiment, an upper surface of the copper layer 1101 is subjected to planarization techniques, such as lapping, polishing, and/or grinding. The above described planarization process continues until an upper surface of the first copper layer 401 is substantially exposed and only a portion of the copper layer 1101 remains as a second copper layer 1201 around the metal layer 901, but below the upper surfaces of the first copper layer 401. As illustrated in FIG. 12, after the planarization process, the copper layer 1101 has been removed from above the copper layer 401. As illustrated in FIG. 12, in one embodiment, a portion of the metal layer 901 deposited above the first copper layer 401 is also removed during the planarization process.

Figure 13:
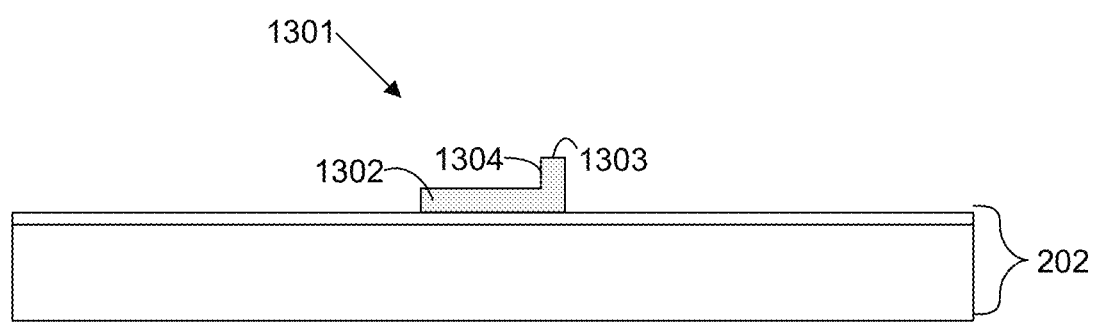

As illustrated in FIG. 13, after the copper layer 1101 and the metal layer 901 have been planarized as illustrated in FIG. 12, the first copper layer 401 and the second copper layer 1201 may be selectively etched to reveal what remains of the metal layer 901. In one embodiment, the remaining metal layer 901 comprises a probe tip 1301 with an L-shaped configuration. In one embodiment, the probe tip 1301 is a contiguous L-shaped structure. As illustrated in FIG. 13, the probe tip 1301 comprises a foot 1302 and an apex 1303. As also illustrated in FIG. 13, a side 1304 of the tip 1301 represents a vertical section of the tip 1301 and defines an apex 1303 height above the foot 1302.

Figure 14:
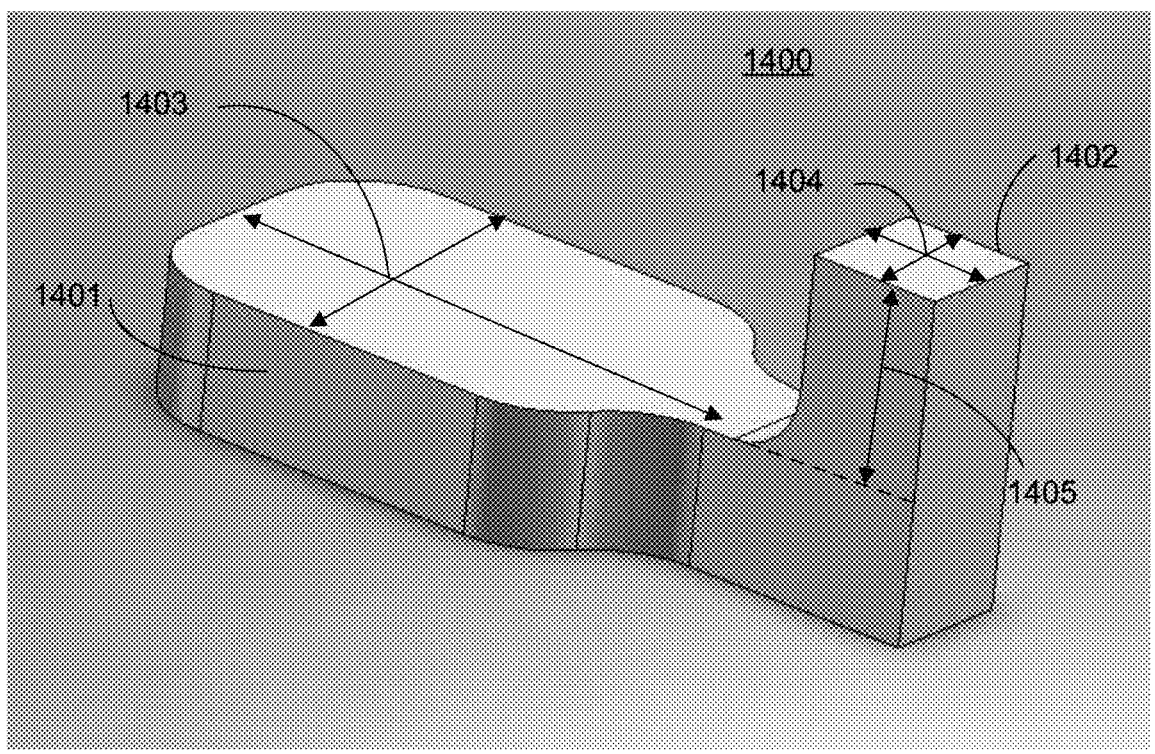
FIG. 14 illustrates an exemplary three-dimensional view of a semiconductor probe tip in accordance with an embodiment of the present invention.

FIG. 14 illustrates an exemplary three-dimensional rendering of one possible probe tip geometry that may be achieved using the process described herein. As illustrated in FIG. 14, and discussed herein, an exemplary probe tip 1400 comprises a foot 1401 with a large cross-section for mechanical robustness and an apex 1402 with a small cross-section for enhanced probing capability. The foot in-plane geometry 1403, illustrated in FIG. 14, is defined by the secondary cavity 701, as illustrated in FIGS. 7 and 8. A thickness of the foot 1401 may be defined by controlling an electro-deposition process that deposits the metal layer 901. As discussed herein, an apex in-plane geometry 1404 may be defined during the fabrication process leading to the creation of the secondary cavity 701, as illustrated in FIGS. 7 and 8. In one embodiment, an apex cross-section 1404 width may range from a few microns to several tens of microns. As also illustrated in FIG. 14, a height 1405 of the apex 1402 above the foot 1401 of the probe tip 1400 may be defined by an amount of material deposited during the metal deposition step, as well as by a selected thickness of the first copper layer 401.

As discussed herein, the height of the apex 1402 above the foot 1401 may be selected to ensure that the apex 1402 is able to adequately engage a target electrical contact, pad, or solder bump without interference from the foot 1401. In one embodiment, a location of interest in a semiconductor device that will be engaged by a probe tip 1400 may be covered by an oxidized layer. In one embodiment, the location of interest may also be surrounded by a wall of oxidized material. Therefore, as discussed herein, the height 1405 of the apex 1402 above the foot 1401 needs to be sufficient so that the foot 1401 of the probe tip does not contact the oxidized material.

Figure 15:
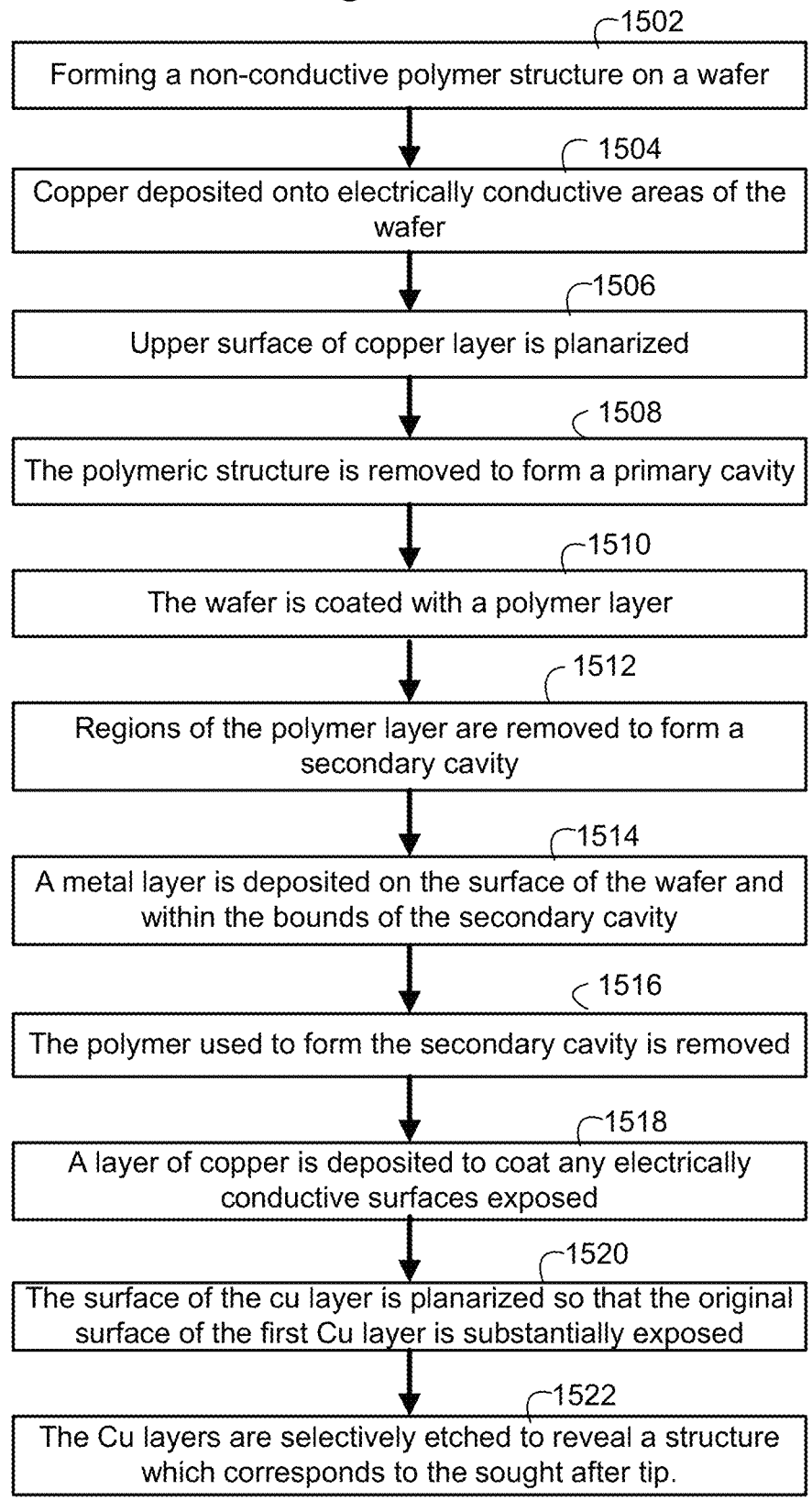
FIG. 15 illustrates an exemplary flow diagram, illustrating the steps to an exemplary process for forming a semiconductor probe tip in accordance with an embodiment of the present invention.

FIG. 15 illustrates exemplary steps to a process for fabricating a probe tip with a contiguous L-shape, using exemplary lithographic processes. In step 1502 of FIG. 15, a non-conductive polymer structure is formed on a wafer. In one embodiment, the non-conductive polymer structure is a rectangular shape. In one embodiment, the wafer comprises a substrate and a layer of conductive material.

In step 1504 of FIG. 15, a first copper layer is deposited on exposed electrically conductive areas of the wafer. As discussed herein, the first copper layer will not be deposited onto the non-conductive polymer structure. In step 1506 of FIG. 15, an upper surface of the copper layer is planarized.

In step 1508 of FIG. 15, the polymeric structure is removed to form a primary cavity in the first copper layer. In one embodiment, the primary cavity comprises a conductive bottom side and four conductive sidewalls.

In step 1510 of FIG. 15, the wafer and first copper layer are coated with a polymer layer. In step 1512 of FIG. 15, portions of the polymer layer are removed to form a secondary cavity. In one embodiment, the secondary cavity begins in the primary cavity and extends up a sidewall of the first copper layer and onto a top surface of the first copper layer.

In step 1514 of FIG. 15, a metal layer is deposited on the surface of the wafer and within the bounds of the secondary cavity. In one embodiment, the metal layer is deposited using metal deposition processes such as electroplating. Therefore, as also illustrated in FIG. 9, the metal layer will only be deposited on exposed electrically conductive surfaces. Therefore, as illustrated in FIG. 9, the metal layer will be formed as an S-shaped layer covering the exposed bottom of the secondary cavity, the single conductive sidewall of the secondary cavity, and the exposed portion of the first copper layer.

In step 1516 of FIG. 15, the polymer layer used to form the secondary cavity is removed. In step 1518 of FIG. 15, a second copper layer is deposited to coat any exposed electrically conductive surfaces. As illustrated in FIG. 11, the first copper layer 401, the exposed portion of the conductive layer 202b of the substrate 202, and the metal layer 901 are covered by the second copper layer 1101. In step 1520 of FIG. 15, the surface of the second copper layer 1101 is planarized so that an upper surface of the first copper layer 401 is substantially exposed and a portion of the metal layer above the first copper layer 401 is removed.

In step 1522 of FIG. 15, the first and second copper layers 401, 1101 are removed by selectively etching to reveal the metal layer 901 with a contiguous L-shape.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A system for electrically testing a semiconductor device, the system comprising:
   an electrical structure; and
   a probe card comprising a probe, wherein the probe comprises a probe tip; wherein the probe tip comprises:
   a foot with a first cross-section; and
   an apex with a second cross-section, wherein the first cross-section is wider than the second cross-section, and wherein the probe tip comprises an integral metal structure, wherein the probe tip mechanically engages with the electrical structure on the semiconductor device, wherein a height of the apex of the probe tip is greater than a height of the foot of the probe tip, wherein the probe tip comprises a contiguous metal layer; wherein the contiguous metal layer has a contiguous S-shaped configuration, wherein a width of the apex ranges from 3 microns to 30 microns,
   wherein the height of the apex is defined by an amount of material deposited during a metal deposition step during a fabrication of the probe tip; and
   wherein the electrical structure is surrounded by a wall of material, wherein the apex of the probe tip engages with a surface of the electrical structure without the foot of the probe tip contacting the material.

2. The system for electrically testing the semiconductor device of claim 1, wherein the foot of the probe tip is physically connected to the probe, and wherein the apex of the probe tip physically contacts the semiconductor device.

3. The system for electrically testing the semiconductor device of claim 1 wherein the electrical structure is surrounded by a wall of dielectric material, wherein the apex of the probe tip is operable to engage with the surface of the electrical structure without the foot of the probe tip contacting the dielectric material.

4. The system for electrically testing the semiconductor device of claim 1 wherein the electrical structure is surrounded by a wall of passivation material, wherein the apex of the probe tip is operable to engage with the surface of the electrical structure without the foot of the probe tip contacting the passivation material.

5. The system for electrically testing the semiconductor device of claim 1, wherein the electrical structure is covered by an oxidized layer, wherein the apex of the probe tip is operable to engage with the surface of the electrical structure without the foot of the probe tip contacting the oxidized layer.

6. A probing system comprising:
   an electrical structure; and
   a probe tip, wherein the probe tip comprises:
   a foot with a first cross-section; and
   an apex with a second cross-section, wherein the first cross-section is wider than the second cross-section, and wherein the probe tip comprises an integral metal structure, wherein the probe tip mechanically engages with the electrical structure on a semiconductor device, wherein a height of the apex of the probe tip is greater than a height of the foot of the probe tip, wherein the probe tip comprises a contiguous metal layer; wherein the contiguous metal layer has a contiguous S-shaped configuration, wherein a width of the apex ranges from 3 microns to 30 microns,
   wherein the height of the apex is defined by an amount of material deposited during a metal deposition step during a fabrication of the probe tip; and
   wherein the electrical structure is surrounded by a wall of material, wherein the apex of the probe tip engages with a surface of the electrical structure without the foot of the probe tip contacting the material.

7. The probing system of claim 6, wherein the foot of the probe tip is physically connected to the probe, and wherein the apex of the probe tip physically contacts the semiconductor device.

8. The probing system of claim 6 wherein the electrical structure is surrounded by a wall of dielectric material, wherein the apex of the probe tip is operable to engage with the surface of the electrical structure without the foot of the probe tip contacting the dielectric material.

9. The probing system of claim 6 wherein the electrical structure is surrounded by a wall of passivation material, wherein the apex of the probe tip is operable to engage with the surface of the electrical structure without the foot of the probe tip contacting the passivation material.

10. The probing system of claim 6, wherein the electrical structure is covered by an oxidized layer, wherein the apex of the probe tip is operable to engage with the surface of the electrical structure without the foot of the probe tip contacting the oxidized layer.

* * * * *